United States Patent
Yu et al.

(10) Patent No.: US 10,677,865 B2
(45) Date of Patent: Jun. 9, 2020

(54) MAGNETIC RESONANCE IMAGING DEVICE AND SHIMMING METHOD THEREOF

(71) Applicant: SHANGHAI UNITED IMAGING HEALTHCARE CO., LTD., Shanghai (CN)

(72) Inventors: Xingen Yu, Shanghai (CN); Yong Liu, Shanghai (CN); Shuguang Liu, Shanghai (CN); Jiwen Yang, Shanghai (CN); Tao Wang, Shanghai (CN); Baogang Peng, Shanghai (CN); Man Fan, Shanghai (CN); Lifeng Wang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 10 days.

(21) Appl. No.: 16/018,119

(22) Filed: Jun. 26, 2018

(65) Prior Publication Data
US 2019/0137582 A1    May 9, 2019

(30) Foreign Application Priority Data
Nov. 3, 2017  (CN) .......................... 2017 1 1072774

(51) Int. Cl.
| | |
|---|---|
| *G01R 33/3875* | (2006.01) |
| *G01R 33/00* | (2006.01) |
| *G01R 33/48* | (2006.01) |
| *G01R 33/3873* | (2006.01) |
| *G01R 33/385* | (2006.01) |

(52) U.S. Cl.
CPC ....... *G01R 33/3875* (2013.01); *G01R 33/007* (2013.01); *G01R 33/0047* (2013.01); *G01R 33/3854* (2013.01); *G01R 33/3873* (2013.01); *G01R 33/48* (2013.01)

(58) Field of Classification Search
CPC ....................... G01R 33/3875; G01R 33/0047
USPC ....................................................... 324/307
See application file for complete search history.

(56) References Cited

U.S. PATENT DOCUMENTS

| | | | | |
|---|---|---|---|---|
| 5,550,472 | A * | 8/1996 | Richard | ............. G01R 33/3873 324/319 |
| 7,884,605 | B2 | 2/2011 | Tamura et al. | |
| 2007/0164725 | A1 | 7/2007 | Eberlein et al. | |
| 2010/0237867 | A1 | 9/2010 | Slade | |

(Continued)

FOREIGN PATENT DOCUMENTS

| | | |
|---|---|---|
| CN | 101334455 A | 12/2008 |
| CN | 205958735 U | 2/2017 |

*Primary Examiner* — Reena Aurora
(74) *Attorney, Agent, or Firm* — Metis IP LLC

(57) ABSTRACT

The present disclosure relates to a magnetic resonance imaging device and shimming methods on the magnetic resonance imaging device. The magnetic resonance imaging device includes a main magnet, gradient coils, a vacuum enclosure, and a shimming conduit. The vacuum enclosure is configured to house at least part of the shimming conduit. The vacuum enclosure and at least part of the shimming conduit defines a hermetically sealed space configured to house the gradient coils. The shimming conduit has at least one opening configured to allow for access to an interior of the shimming conduit. The interior of the shimming conduit is hermetically insulated from the hermetically sealed space.

20 Claims, 13 Drawing Sheets

(56) References Cited

U.S. PATENT DOCUMENTS

2015/0346294 A1* 12/2015 Nogami ............ G01R 33/3873
324/322
2017/0285121 A1 10/2017 Aley et al.

* cited by examiner

MAGNETIC RESONANCE IMAGING DEVICE AND SHIMMING METHOD THEREOF

CROSS-REFERENCE TO RELATED APPLICATIONS

The present disclosure claims priority of Chinese Application No. CN 201711072774.5, filed on Nov. 3, 2017, the contents of which are hereby incorporated by reference.

TECHNICAL FIELD

The present disclosure generally relates to magnetic resonance imaging (MRI), and more particularly, to an MRI device and a shimming method thereof.

BACKGROUND

In a traditional MRI device, gradient coils are located within the main magnetic field. Due to the existence of the alternating current in the gradient coils, electrified wires in the gradient coils are subject to the Lorentz force according to the left-hand law of electromagnetism. Due to the existence of the alternating current, the force of the electrified wires in the gradient coils alter correspondingly. That may lead to violent vibrations which in turn may cause noise during a gradient switch. The transmission of the noise can be achieved through two means: air and structural components. In the airborne transmission, air surrounding the gradient coils can propagate the vibrations to adjacent components, for example, the shell of the MRI device. In the structure-borne transmission, vibrations generated in the gradient coils are sent to other nearby components through structural components. The structural components used herein may include different kinds of components contacting the gradient coils including, for example, a magnet, body coils, a shell, etc.

In a traditional MRI system, vibration sources (for example, gradient coils) are sealed in a vacuum environment, in order to decrease the noise transmission from within the MRI system. However, the conventional shimming cannot be performed while the gradient coils are sealed in the vacuum environment. Therefore, vacuum operations of the gradient coils are usually performed after shimming in a non-vacuum environment. Equipment for vacuum operations and operators may be needed for the initial installation of the MRI device. Additionally, vacuum operations are needed after every shimming maintenance, which takes extra time and resources.

SUMMARY

According to an aspect of the present disclosure, a magnetic resonance imaging device may include a main magnet, gradient coils, a vacuum enclosure, and a shimming conduit. The vacuum enclosure may be configured to house at least part of the shimming conduit. The vacuum enclosure and at least part of the shimming conduit may define a hermetically sealed space configured to house the gradient coils. The shimming conduit may have at least one opening configured to allow for access to an interior of the shimming conduit. The interior of the shimming conduit may be hermetically insulated from the hermetically sealed space.

In some embodiments, the vacuum enclosure may include at least one escape end configured to allow for access to the interior of the shimming conduit.

In some embodiments, a portion of the shimming conduit may be dimensioned to fit snugly with an escape end of the at least one escape end of the vacuum enclosure.

In some embodiments, an opening of the at least one opening of the shimming conduit may be dimensioned to fit snugly with an escape end of the at least one escape end of the vacuum enclosure.

In some embodiments, at least part of the shimming conduit may be located within the gradient coils.

In some embodiments, the gradient coils may include a shimming space. The shimming conduit may be located within the shimming space.

In some embodiments, the magnetic resonance imaging device may further include a connecting conduit. The shimming space and the connecting conduit may form the shimming conduit.

In some embodiments, the connecting conduit may be made of a flexible material.

In some embodiments, the shimming conduit may be located within a first gap between the vacuum enclosure and a side wall of the gradient coils, the side wall being away from the main magnet.

In some embodiments, the shimming conduit may be located within a second gap between the vacuum enclosure and a side wall of the gradient coils, the side wall being adjacent to the main magnet.

In some embodiments, the shimming conduit may be located within a third gap between the main magnet and a side wall of the gradient coils, the side wall being adjacent to the main magnet.

In some embodiments, the vacuum enclosure may be formed by body coils and two connecting caps. The body coils may be located on a side of the gradient coils away from the main magnet. Each connecting cap may be configured to connect an end of the body coils to a corresponding end of the main magnet by forming a hermetic seal.

According to an aspect of the present disclosure, a shimming method implemented on a magnetic resonance imaging device may be provided. The magnetic resonance imaging device may include a main magnet, gradient coils, a vacuum enclosure, and a shimming conduit. The vacuum enclosure may be configured to house at least part of the shimming conduit. The vacuum enclosure and at least part of the shimming conduit may define a hermetically sealed space configured to house the gradient coils. The shimming conduit may have at least one opening configured to allow for access to an interior of the shimming conduit. The interior of the shimming conduit may be hermetically insulated from hermetically sealed space of the vacuum enclosure. The shimming method may include placing a shimming component in the shimming conduit.

In some embodiments, the shimming method may further include evacuating the hermetically sealed space.

In some embodiments, the shimming method may further include sealing the at least one opening of the shimming conduit using at least one sealing board.

According to an aspect of the present disclosure, a magnetic resonance imaging device may include a main magnet, a gradient coil, a vacuum enclosure, and a shimming conduit. The vacuum enclosure may be attached to the main magnet and configured to house at least part of the shimming conduit. The gradient coil may be located in a hermetically sealed space which is defined inside the vacuum enclosure and outside the shimming conduit. The shimming conduit may have at least one opening configured to allow for access to an interior of the shimming conduit. The interior of the shimming conduit may be hermetically insulated from the hermetically sealed space.

In some embodiments, the vacuum enclosure may include a soundproof tube and two end caps. The main magnet may have a central bore extending along an axial direction. The soundproof tube may be accommodated in the central bore. Each of the two end caps may be connected to the main magnet and the soundproof tube.

In some embodiments, the magnetic resonance imaging device may further include a body coil disposed inside the soundproof tube.

In some embodiments, the magnetic resonance imaging device may further include a body coil. The body coil may form at least part of the soundproof tube.

In some embodiments, the magnetic resonance imaging device may further include one or more escape ends and one or more extraction ports. Each escape end of the one or more escape ends may be dimensioned to fit snugly with the at least one opening of the shimming conduit and configured to allow for access to an interior of the shimming conduit. Each extraction port of the one or more extraction ports may be configured to allow for access to an interior of the hermetically sealed space.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirits and scope of the present disclosure. Thus, the present disclosure is not limited to the embodiments shown, but to be accorded the widest scope consistent with the claims.

It will be understood that the term "system," "module," "unit," and/or "block" used herein are one method to distinguish different components, elements, parts, section or assembly of different level in descending order. However, the terms may be displaced by other expression if they may achieve the same purpose.

It will be understood that the term "vertical", "horizontal", "left", and/or "right" used herein are merely for the purposes of illustration and are not intended to be limiting. Such terms are used to show positions of components relative to one other.

It will be understood that when a unit, module or block is referred to as being "on," "connected to" or "coupled to" another unit, module, or block, it may be directly on, connected or coupled to the other unit, module, or block, or intervening unit, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include," and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

Figure 1:
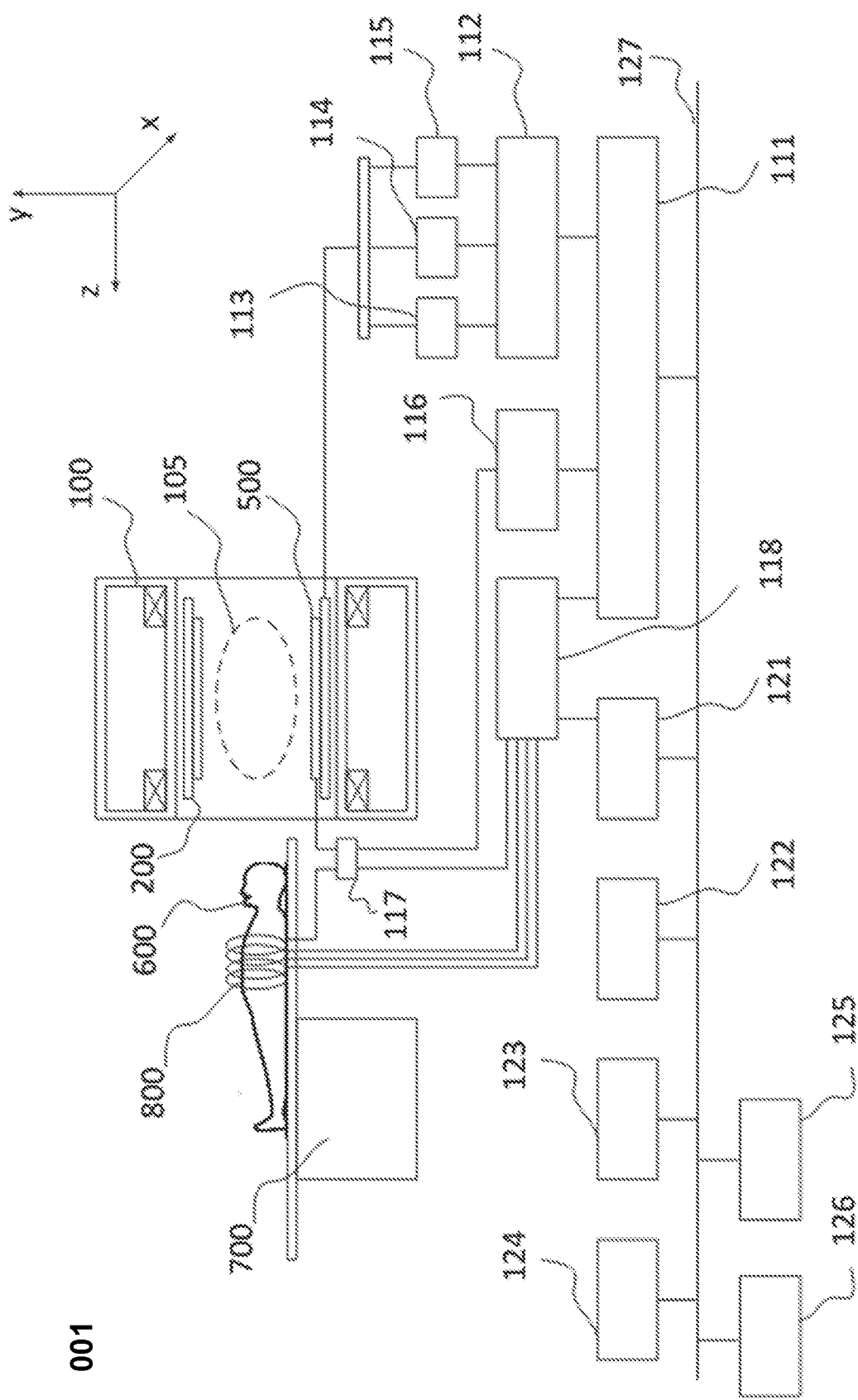
FIG. 1 illustrates an exemplary magnetic resonance imaging (MRI) system according to some embodiments of the present disclosure.

Provided herein are an MRI device and a shimming method thereof. The MRI device may include a main magnet, gradient coils, a vacuum enclosure, and a shimming conduit (also referred to as shimming slot). The vacuum enclosure and at least part of the shimming conduit may define a hermetically sealed space configured to house the gradient coils. The shimming conduit may have at least one opening configured to allow for access to an interior of the shimming conduit from, e.g., the ambient environment so that an operation (e.g., placing, removing, replacing a shimming component) in the shimming conduit or a portion thereof. The interior of the shimming conduit may be hermetically insulated from the hermetically sealed space of the vacuum enclosure. Thus, the hermetically sealed space may be evacuated while the interior of the shimming conduit is not. Accordingly, shimming components may be placed, replaced, removed, etc., in the magnetic field (e.g., the shimming conduit) without destroying the vacuum environment of the gradient coils. Then, the airborne transmission of noise caused by the gradient coils may be decreased or inhibited. FIG. 1 is a block diagram illustrating an exemplary MRI system according to some embodiments of the present disclosure. The MRI system may include an MRI device 001.

The MRI device 001 may include a gantry (not shown in FIG. 1), a scanning bed 700, and an imaging area 105. The gantry may be configured to accommodate a main magnet 100. The main magnet 100 may be configured to generate a main magnetic field, for example, 0.2 T, 0.5 T, 1.0 T, 1.5 T, 3.0 T, or another strength. In some embodiments, the main magnet 100 may have a cylindrical shape, which forms a central bore and defines the imaging area 105 (e.g., a housing cavity 110 shown in FIG. 2). The housing cavity 110 may be along the axis of the main magnet 100 (e.g., the axis DD' shown in FIG. 3). In some embodiments, the main magnet 100 may include a superconducting magnet, a permanent magnet, or the like. The superconductive magnet may include a bobbin, a plurality of superconducting coils around the bobbin, and a shell.

During a scanning by the MRI device 001, an imaging object 600 lying on the scanning bed 700 may be moved into the imaging area 105 where the main magnetic field distribution is relatively uniform.

Furthermore, the MRI device 001 may include a pulse control unit 111, amplifiers 113, 114, and 115, an RF pulse generation unit 116, a switch control unit 117, body coils 500, local coils 800, an RF receiver unit 118, and an image reconstruction unit 121. The pulse control unit 111 may cause the RF pulse generation unit 116 to generate RF pulses that may be amplified by the amplifiers 113, 114, and/or 115. After passing through the switch control unit 117, the amplified RF pulses may be sent out by the body coils 500 or the local coils 800, which may excite the imaging object 600. The imaging object 600 may generate corresponding RF signals in response to the RF excitation. The body coils 500 or the local coils 800 may receive the corresponding RF signals through a plurality of RF receiving paths. Then, through the RF receiver unit 118, the corresponding RF signals may be sent to the image reconstruction unit 121 for image construction.

Furthermore, the MRI device 001 may include gradient coils 200 and a gradient signal generation unit 112. The gradient coils 200 may be configured to spatially encode RF signals. The pulse control unit 111 may cause the gradient signal generation unit 112 to generate gradient signals. The gradient signals may be separated into three mutually orthogonal signals, for example, a x-direction gradient signal, a y-direction gradient signal, and a z-direction gradient signal. The three mutually orthogonal signals may be amplified by the amplifiers 113, 114, and/or 115 respectively in a x-direction, a y-direction, and a z-direction. Then, the three mutually orthogonal signals may be sent out by the gradient coils 200, thereby generating a gradient field in the imaging area 105. In the present disclosure, the x-direction may point from the right hand of the imaging object 600 toward the left hand of the imaging object 600. The y-direction may point from the anterior of the imaging object 600 toward the posterior of the imaging object 600. The z-direction may point from the superior of the imaging object 600 to the inferior of the imaging object 600, i.e., along the axial direction of the main magnet 100. It should be noted that the x-direction, the y-direction, and the z-direction may be provided for illustration purposes and not intended to be limiting.

The gradient coils 200 may be configured to generate a gradient field. The gradient coils 200 may include three sets of sub-gradient coils referred to as Gx gradient coils, Gy gradient coils, and Gz gradient coils. Correspondingly, the three sets of sub-gradient coils may generate three sub-gradient fields. In some embodiments, the three sub-gradient fields may be mutually orthogonal in spatial. For example, the Gx gradient coils may generate a sub-gradient field in the x-direction. The Gy gradient coils may generate a sub-gradient field in the y-direction. The Gz gradient coils may generate a sub-gradient field in the z-direction. In some embodiments, in order to generate a gradient field in a desired direction, the three sets of sub-gradient coils may be operated individually or in combination.

In some embodiments, the gradient coils 200 (for example, the three sets of sub-gradient coils) may be configured as an integral piece by injection molding. The integral piece may be made of resin or a nonmagnetic material. The integral piece may have a cylindrical structure, which adapts to the housing cavity 110 of the main magnet 100. The exterior wall of the gradient coils 200 may be sealed and air-locked. The interior wall of the gradient coils 200 may include a hole. The hole may extend along the axis of the main magnet 100, which may provide a patient channel (i.e., the imaging area 105) for the movement of the scanning bed 700. As used in the present disclosure, the exterior wall of the gradient coils 200 may refer to a wall adjacent to the main magnet 100. The interior wall of the gradient coils 200 may refer to a wall away from the main magnet 100.

In some circumstances, the gradient coils 200 may generate noise that may make the imaging object 600 uncomfortable and even interfere with the scanning. In order to decrease the airborne transmission of the noise, the MRI device 001 may further include a vacuum enclosure 300 (shown in FIG. 2). The vacuum enclosure 300 may be configured to house the gradient coils 200. In some embodiments, the vacuum enclosure 300 may include one or more shimming conduits 400 configured to accommodate shimming components. A shimming conduit 400 may include at least one opening configured to allow an operation in the interior of the shimming conduit from the outside (i.e., the ambient air). Thus, the inner space of the vacuum enclosure 300 except for the interior of the shimming conduit 400 may be sealed and evacuated. Accordingly, the shimming components may be placed in the main magnetic field without destroying or impairing the vacuum environment of the gradient coils 200. More details regarding the vacuum enclosure 300 and the one or more shimming conduits 400 may be found elsewhere in the present disclosure. See, e.g., FIGS. 2 to 12 and the description thereof.

Furthermore, the MRI device 001 may include a processor 122, a display 123, an I/O device 124, a storage device 125, a communication port 126, and a communication bus 127.

The processor 122 may be configured to control other components in the MRI device 001 (e.g., the scanning bed 700, the pulse control unit 111), processing data acquired by the MRI device 001, or the like, or a combination thereof. For example, the processor 122 may cause the scanning bed 700 to move to a desired position. As another example, the processor 122 may control the pulse control unit 111 to cause the gradient signal generation unit 112 to generate gradient signals. The processor 122 may include one or more processors which may execute computer instructions (program code) and perform functions in accordance with techniques described herein. For example, to shim the MRI device 001, the processor 122 may execute computer instructions to determine the locations and number of shimming components in the shimming conduit(s) 400. In some embodiments, the processor 122 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

The display 123 may be configured to display an interface to a user. The exemplary display device may include a liquid crystal display (LCD), a light-emitting diode (LED)-based display, a flat panel display, a curved screen, a television device, a cathode ray tube (CRT), or the like, or a combination thereof.

The I/O device 124 may be configured to input or output signals, data or information. In some embodiments, the I/O 230 may include an input device and an output device. The exemplary input device may include a keyboard, a mouse, a touch screen, a microphone, or the like, or a combination thereof. The exemplary output device may include a display device, a loudspeaker, a printer, a projector, or the like, or a combination thereof.

The storage device 125 may be configured to store various data and/or instructions. In some embodiments, the storage device 125 may store data and/or instructions that the processor 122 may execute or use to perform exemplary methods described in the present disclosure. In some embodiments, the storage device 125 may include a mass storage device, a removable storage device, a volatile read-and-write memory, a read-only memory (ROM), or the like, or any combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. The exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 150 may be implemented on a cloud platform.

The communication port 126 may be configured to establish connections between external devices, image acquisition devices, database, exterior storage and image processing workstations. The connection may be a wired connection, a wireless connection, or combination of both that enables data transmission and reception. The wired connection may include electrical cable, optical cable, telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 126 may be a standardized communication port, such as RS232, RS485, etc.

The communication bus 127 may be configured for data transmission. For example, the communication bus 127 may perform data transmission between the pulse control 111, the image reconstruction unit 121, the display 123, the I/O device 124, the storage device 125, and/or the communication port 126, so as to control the MRI process.

It should be noted that the above description of the MRI system is merely provided for the purposes of illustration, and not intended to limit the scope of the present disclosure. For persons having ordinary skills in the art, multiple variations and modifications may be made under the teachings of the present disclosure. For example, the assembly and/or function of the MRI system may be varied or changed according to specific implementation scenarios. Merely by way of example, some other components may be added into the MRI system, such as a patient positioning module. The MRI system may be a single-modality imaging system, or part of a multi-modality system including, e.g., a positron emission tomography-magnetic resonance imaging (PET-MRI) system, etc. However, those variations and modifications do not depart from the scope of the present disclosure.

Figure 2:
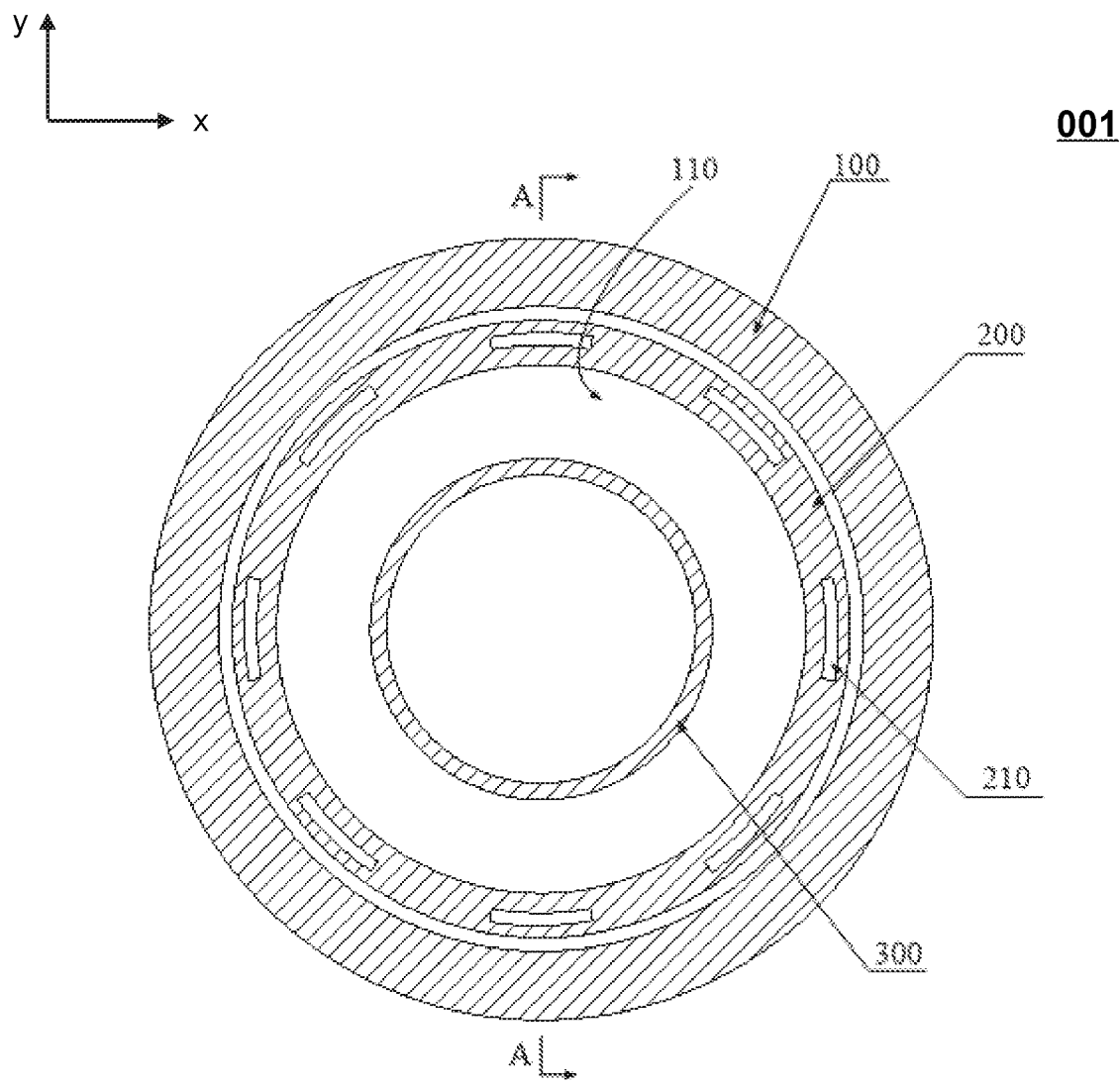
FIG. 2 is a schematic diagram illustrating a sectional view of a first exemplary MRI device 001 according to some embodiments of the present disclosure.

FIG. 2 is a schematic diagram illustrating a sectional view of a first exemplary MRI device according to some embodiments of the present disclosure. The sectional view may be taken along the axis of the main magnet 100. As illustrated, the MRI device 001 may include the main magnet 100, the gradient coils 200, and the vacuum enclosure 300.

The main magnet 100 may have a cylindrical shape, which forms a housing cavity 110. The housing cavity 100 may be along the axis of the main magnet 100 (e.g., the axis DD' shown in FIG. 3). The gradient coils 200 may be installed in the housing cavity 110 of the main magnet 100.

In some embodiments, the gradient coils 200 may include one or more shimming spaces 210. A shimming space 210 may extend along the axis of the gradient coils 200 (i.e., the axis of the main magnet 100). A shimming space 210 may be configured to include one or more shimming conduits 400 (shown in FIG. 3). In some embodiments, the one or more shimming spaces 210 may be located in the gradient coils 200 circumferentially. In some embodiments, the one or more shimming spaces 210 may be distributed evenly along the circumferential direction in the gradient coils 200. In some embodiments, when the gradient coils 200 include main gradient coils and secondary gradient coils, the one or more shimming spaces 210 may be distributed evenly along the circumferential direction between the main gradient coils and the secondary gradient coils.

The vacuum enclosure 300 may be configured to house the gradient coils 200. In some embodiments, when the portion of the vacuum enclosure 300 housing the gradient coils 200 is evacuated, the gradient coils 200 may be sealed in a vacuum environment within the vacuum enclosure 300. Consequently, the airborne transmission of noise caused by the gradient coils 200 may be inhibited or decreased.

In some embodiments, the vacuum enclosure 300 may house both the gradient coils 200 and the main magnet 100. Alternatively, the vacuum enclosure 300 may house only the gradient coils 200. The gradient coils 200 may be located between the vacuum enclosure 300 and the main magnet 100.

The vacuum enclosure 300 may be mechanically connected directly or indirectly to the main magnet 100. For example, the vacuum enclosure 300 may be mechanically connected directly to the main magnet 100. In this circumstance, the direct connection between the vacuum enclosure 300 and the main magnet 100 may be achieved without any extra connecting components. In some embodiment, the vacuum enclosure 300 and the main magnet 100 may be connected hermetically.

In order to decrease the eddy current caused by the vacuum enclosure 300, at least part of the vacuum enclosure 300 may be made of a nonmagnetic material. For example, the part of the vacuum enclosure 300 located in a magnetic field (e.g., the main magnet field, the gradient magnet field) may be made of a nonmagnetic material, while other parts of the vacuum enclosure 300 located outside a magnetic field may be made of another nonmagnetic material or a nonmagnetic material. The part of the vacuum enclosure 300 located in the magnetic field may include a soundproof tube (e.g., a soundproof tube shown in FIG. 12).

It should be noted that the above description of the MRI device is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 3:
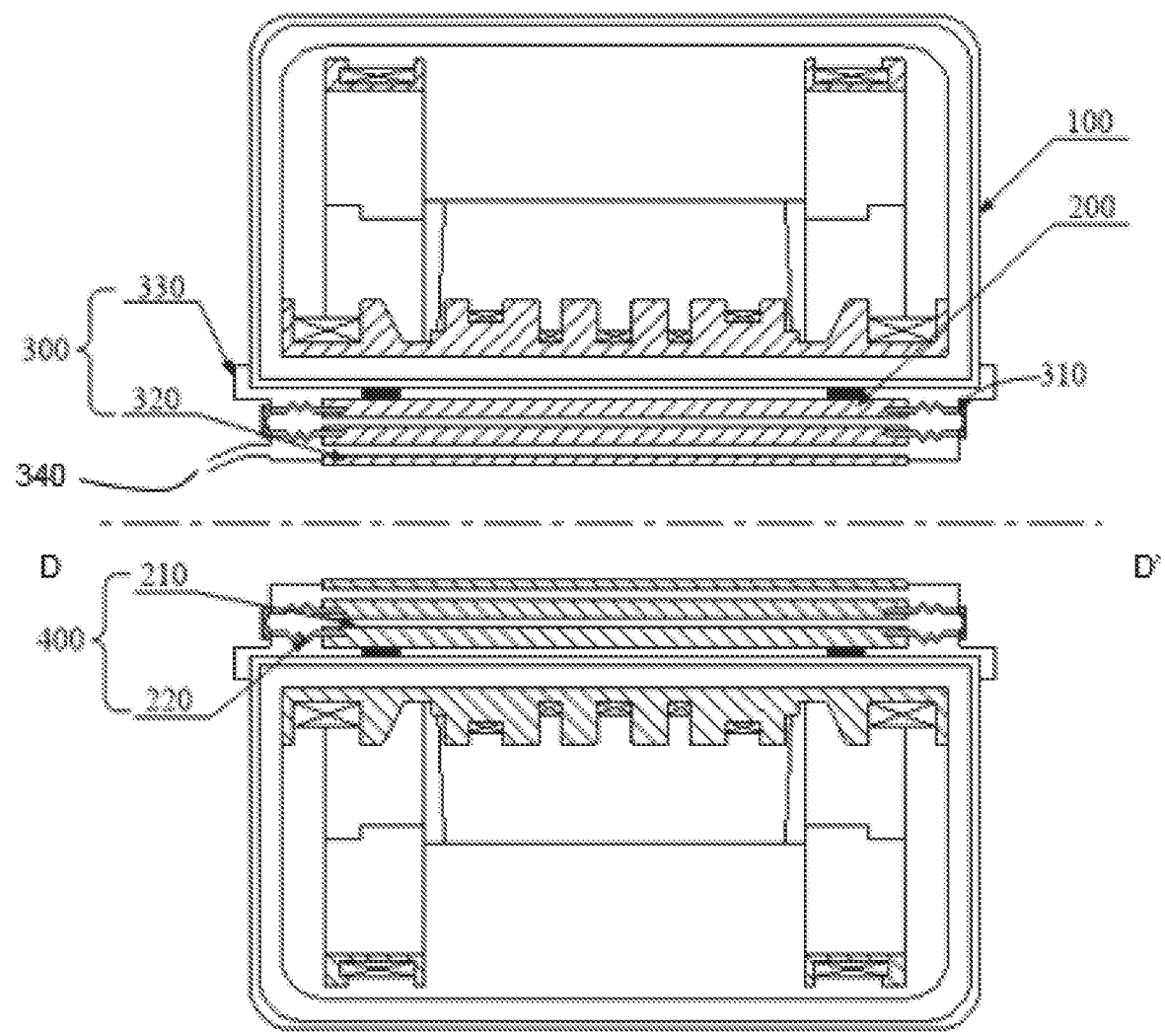
FIG. 3 is a schematic diagram illustrating a sectional view taken along A-A of FIG. 2 according to some embodiments of the present disclosure.

FIG. 3 is a schematic diagram illustrating a sectional view taken along A-A of FIG. 2 according to some embodiments of the present disclosure. The sectional view may be taken along the axis of the main magnet 100. Referring to FIG. 2, in some embodiments, one or more shimming spaces 210 may be distributed evenly along the circumferential direction in the gradient coils 200. In these circumstances, as shown in FIG. 3, the structure of the shimming spaces 210 may be symmetrical or substantially symmetrical with respect to the axis DD'.

The vacuum enclosure 300 may include one or more escape ends 310, one or more soundproof tubes 320, and one or more end caps 330. Referring to FIG. 2, in some embodiments, the vacuum enclosure 300 may house only the gradient coils 200 but not the main magnet 100. The vacuum enclosure 300 may be mechanically connected to the main magnet 100. In these circumstances, the vacuum enclosure 300 may be mechanically connected to the main magnet 100 through the one or more end caps 330. For example, the vacuum enclosure 300 may be mechanically connected to the main magnet 100 through two end caps 330. One end cap 330 may connect to one end of the vacuum enclosure 300. Details regarding to the vacuum enclosure 300 may be found elsewhere in the present disclosure. See, e.g., FIG. 12 and the descriptions thereof.

The vacuum enclosure 300 may be configured to house at least part of one or more shimming conduits 400. A shimming conduit 400 may be configured to accommodate one or more shimming components. A shimming component may be an object or component used for shimming. A shimming component may be of the shape, for example, a bar, a cube, a ball.

In some embodiments, the extending direction of a shimming conduit 400 may be parallel to the axial direction of the main magnet 100 (i.e., the direction of the DD' axis). In some embodiments, a shimming conduit 400 may be located in a shimming space 210. Accordingly, shimming components may be placed within the gradient coils 200.

In some embodiments, a shimming conduit 400 may include two openings. Accordingly, for each shimming conduit, the vacuum enclosure 300 may include two escape ends 310 corresponding to the two openings. At the same time, two connecting conduits 220 may connect the two openings of the shimming conduit 400 and the two escape ends 310 of the vacuum enclosure 300 such that the shimming conduit 400 is accessible from the ambient environment via the escape end(s) 310 and the connecting conduit(s) 220.

In some embodiments, the opening(s) of the shimming conduit 400 and/or the escape ends 310 of the vacuum enclosure 300 may be sealed by one or more sealing boards.

The sizes of the shimming space 210, the shimming conduit 400, the escape end(s) 310, and the connecting conduit(s) 220 may be such that these structures fit each other. For example, a portion of the shimming conduit 400 (e.g., the opening(s) of the shimming conduit 400) may be dimensioned to fit snugly with the escape end 310 of the vacuum enclosure 300. As another example, a portion of the shimming conduit 400 (e.g., the opening(s) of the shimming conduit 400) may be dimensioned to fit snugly with the connecting conduit(s) 220. As still another example, a portion of the shimming conduit 400 (e.g., the wall of the shimming conduit 400) may be dimensioned to fit snugly with the shimming space 210.

In some embodiments, a shimming conduit 400 may be separate from a shimming space 210. The shimming conduit 400 may be separately configured in the shimming space 210. Alternatively, the shimming space 210 may be inseparate from the shimming conduit 400 and may be an integral part of the shimming conduit 400. For example, a shimming space 210 and a connecting conduit 220 together may form a shimming conduit 400. The connecting conduit 220 may be configured to connect the interior of the shimming space 210 and/or the shimming conduit 400 with the outside (i.e., the ambient air or the ambient environment).

In some embodiments, a shimming conduit 400 may be made of a nonmagnetic material. Thus, the interference of the shimming conduit 400 on the magnetic field may be reduced.

In some embodiments, the connecting conduit 220 may be a flexible connecting conduit, i.e., a non-rigid conduit. For example, the connecting conduit 220 may be a corrugated pipe. Accordingly, less vibrations caused by the gradient coils 200 may be transmitted to the vacuum enclosure 300.

As illustrated in FIG. 3, the shimming conduit(s) 400 may be located in the shimming space(s) 210, and the connecting conduit(s) 220 may connect the gradient coils 200 and the vacuum enclosure 300. The shimming conduit(s) 200 may be connected to the vacuum enclosure 300 for example, escape ends 310, such that the shimming conduit(s) 200 may be in communication with the ambient air. In some embodiments, during the production of the gradient coils 200, the connecting conduit(s) 220 and the gradient coils 200 may form an integral piece. The connecting conduit(s) 220 may be fixed on a part of the gradient coils 200. The part of the gradient coils 200 may correspond to the shimming space(s)

210. For example, the connecting conduit(s) 220 may be inserted to the gradient coils 200. The gradient coils 200 may be provided with a support from the vacuum enclosure 300 through the connecting conduit(s) 220.

In some embodiments, the connecting conduit 220 (e.g., a corrugated pipe) may be made of a metal or an alloy thereof. In order to reduce the eddy current caused by the connecting conduit 220 and/or the gradient coils 200, the connecting conduit 220 may be inserted to the gradient coils 200 by a small distance, not deeply.

In some embodiments, the vacuum enclosure 300 and at least part of one or more shimming conduits 400 may define a hermetically sealed space. The hermetically sealed space may refer to the space inside the vacuum enclosure 300 and outside the shimming conduit 400. As used herein, the interior of the hermetically sealed space may remain substantially vacuum. In some embodiments, the vacuum enclosure 300, a shimming conduit 400, and one or more connecting conduits 220 (for example, two connecting conduits 220) may define a hermetically sealed space. The hermetically sealed space may be configured to house the gradient coils 200. In some embodiments, the hermetically sealed space may be evacuated through one or more extraction ports 340, and the gradient coils 200 therein may be maintained in a vacuum environment. At the same time, the interior of the shimming conduit 400 may be in communication with the ambient environment. The communication therebetween may be achieved by a link from the opening(s) of the shimming conduit 400 to the escape end(s) 310 of the vacuum enclosure 300. For example, the connecting conduit 220 may serve as such a link. The interior of the shimming conduit 400 may be hermetically insulated from the hermetically sealed space. When the one or more shimming components are placed in or removed from the shimming conduit 400, the vacuum environment within the hermetically sealed space may remain. The gradient coils 200 may remain in the vacuum environment independent of an operation performed in the shimming conduit 400.

In some embodiments, an escape end 310 may be configured in an end cap 330. An escape end 310 may be dimensioned to fit snugly with the opening of the shimming conduit 400 and configured to allow for access to an interior of the shimming conduit 400. In some embodiments, an extraction port 340 may be configured in an end cap 330. Each extraction port 340 may be configured to allow for access to an interior of the hermetically sealed space.

It should be understood that, for the convenience of the operator of the MRI device 001, the manufacture of the MRI device 001 may evacuate the hermetically sealed space to maintain the gradient coils 200 in the vacuum environment. Due to the communication allowed between the interior of the shimming conduit(s) 400 and the ambient air, an operator of the MRI device 001 may perform shimming without destroying the vacuum environment of the gradient coils 200. Specifically, the operator may place, remove, or replace one or more shimming components in the interior of the shimming conduit(s) 400 without destroying the vacuum environment of the gradient coils 200. Details regarding to the shimming may be found elsewhere in the present disclosure. See, for example, FIG. 12 and the descriptions thereof.

Figure 4:
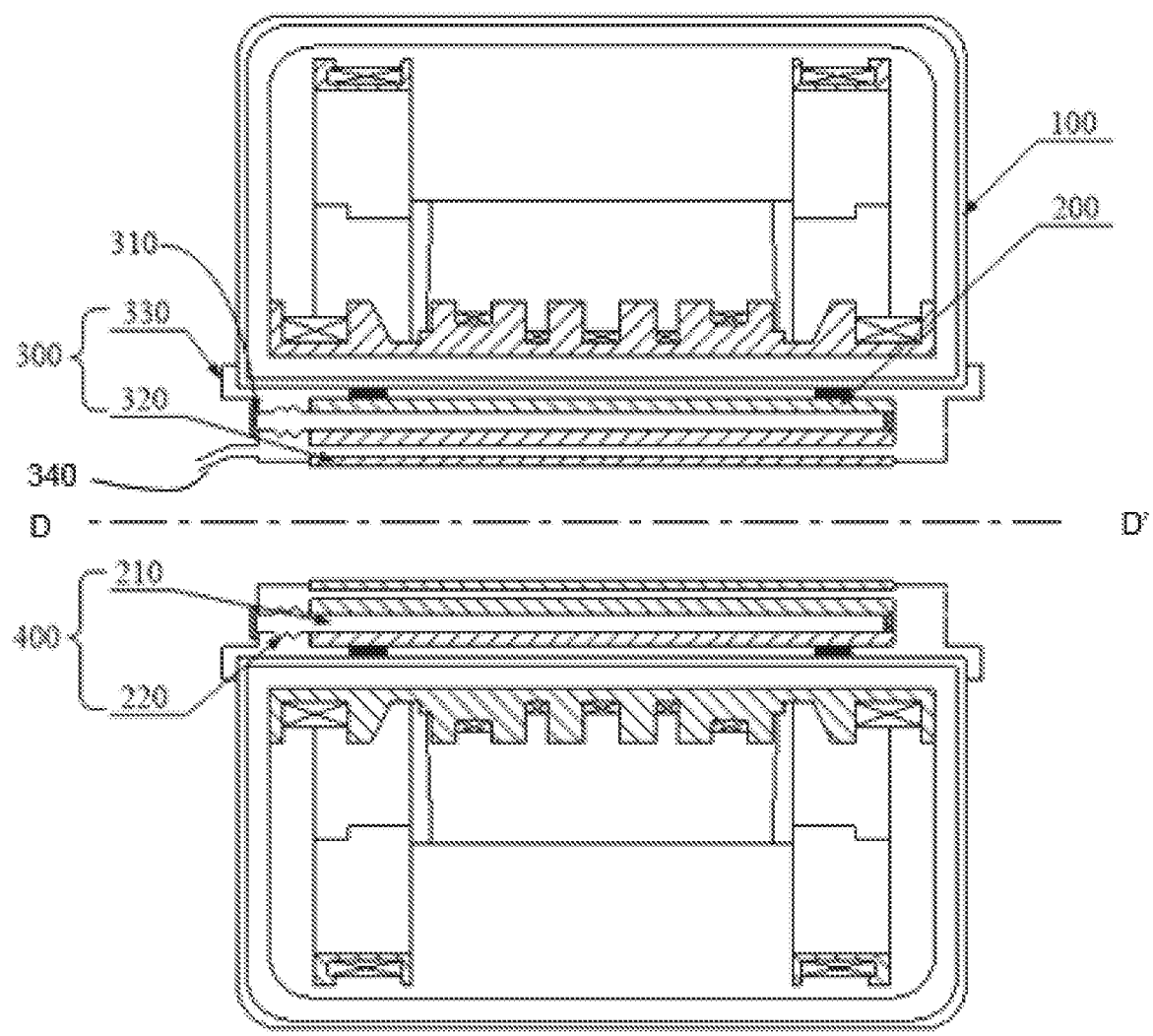
FIG. 4 is a schematic diagram illustrating a sectional view taken along A-A of FIG. 2 according to some embodiments of the present disclosure.

FIG. 4 is a schematic diagram illustrating a sectional view taken along A-A of FIG. 2 according to some embodiments of the present disclosure.

In some embodiments, a shimming conduit 400 may include only one opening. Accordingly, for each shimming conduit 400, the vacuum enclosure 300 may include only one escape end 310 corresponding to the only opening of the shimming conduit 400. At the same time, for each shimming conduit 400, only one connecting conduit 220 may be used to connect the only opening of the shimming conduit 400 and the only escape end 310 of the vacuum enclosure 300 such that the shimming conduit 400 is accessible from the ambient environment via the escape end 310 and the connecting conduit 220. In some embodiments, the other opening of the shimming conduit 400 illustrated in FIG. 3 may be sealed using, for example, silicone, resin, etc. The sealing of the shimming conduit 400 may be hermetic or not.

In some embodiments, the MRI device 001 and components thereof illustrated in FIG. 4 may be substantially the same as those illustrated in FIGS. 2 and 3. For example, a shimming conduit 400 may be located in a shimming space 210. The shimming space 210 may be located in the gradient coils 200. As another example, a shimming conduit 400 may be separately placed in the shimming space 210. Alternatively, a shimming space 210 and a connecting conduit 220 together may form a shimming conduit 400. As still another example, the vacuum enclosure 300, a shimming conduit 400, and one connecting conduit may define a hermetically sealed space. The hermetically sealed space may be evacuated and configured to house the gradient coils 200. Details regarding to the MRI device 001 may be found in the descriptions in connection with FIGS. 2 and 3.

Figure 5:
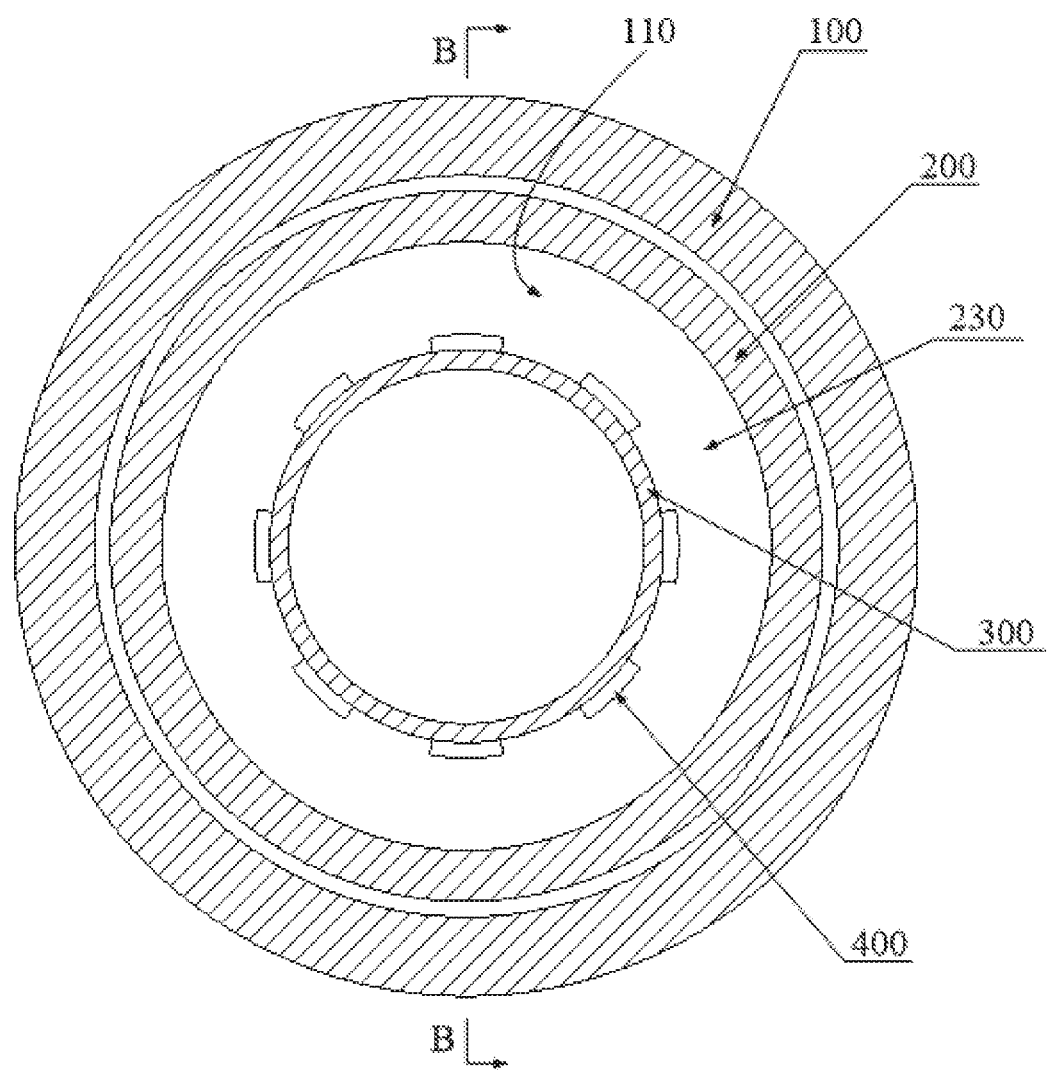
FIG. 5 is a schematic diagram illustrating a sectional view of a second exemplary MRI device according to some embodiments of the present disclosure.

FIG. 5 is a schematic diagram illustrating a sectional view of a second exemplary MRI device 001 according to some embodiments of the present disclosure. The sectional view may be taken along the axis of the main magnet 100.

In some embodiments, the MRI device 001 may lack a shimming space 210. One or more shimming conduits 400 may be located in a gap between the interior wall of the gradient coils 200 and the vacuum enclosure 300. Accordingly, one or more shimming components may be placed in the gap.

As illustrated, the MRI device 001 may include a first gap 230 between the interior wall of the gradient coils 200 and the vacuum enclosure 300. The first gap 230 may extend axially along the axis of the main magnet 100 (e.g., the axis DD' shown in FIG. 6). In some embodiments, one or more shimming conduits 400 may be distributed circumferentially in the first gap 230. In some embodiments, one or more shimming conduits 400 may be distributed evenly in the first gap 230. In some embodiments, at least one of the one or more shimming conduits 400 may be disposed on the wall of the vacuum enclosure 300 in the first gap 230.

In some embodiments, the MRI device 001 and components thereof illustrated in FIG. 5 may be substantially the same as those illustrated in FIG. 2. For example, the MRI device 001 may include the main magnet 100, the gradient coils 200, and the vacuum enclosure 300. The vacuum enclosure 300 may be configured to house the gradient coils 200.

It should be noted that the above description of the MRI device 001 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 6:
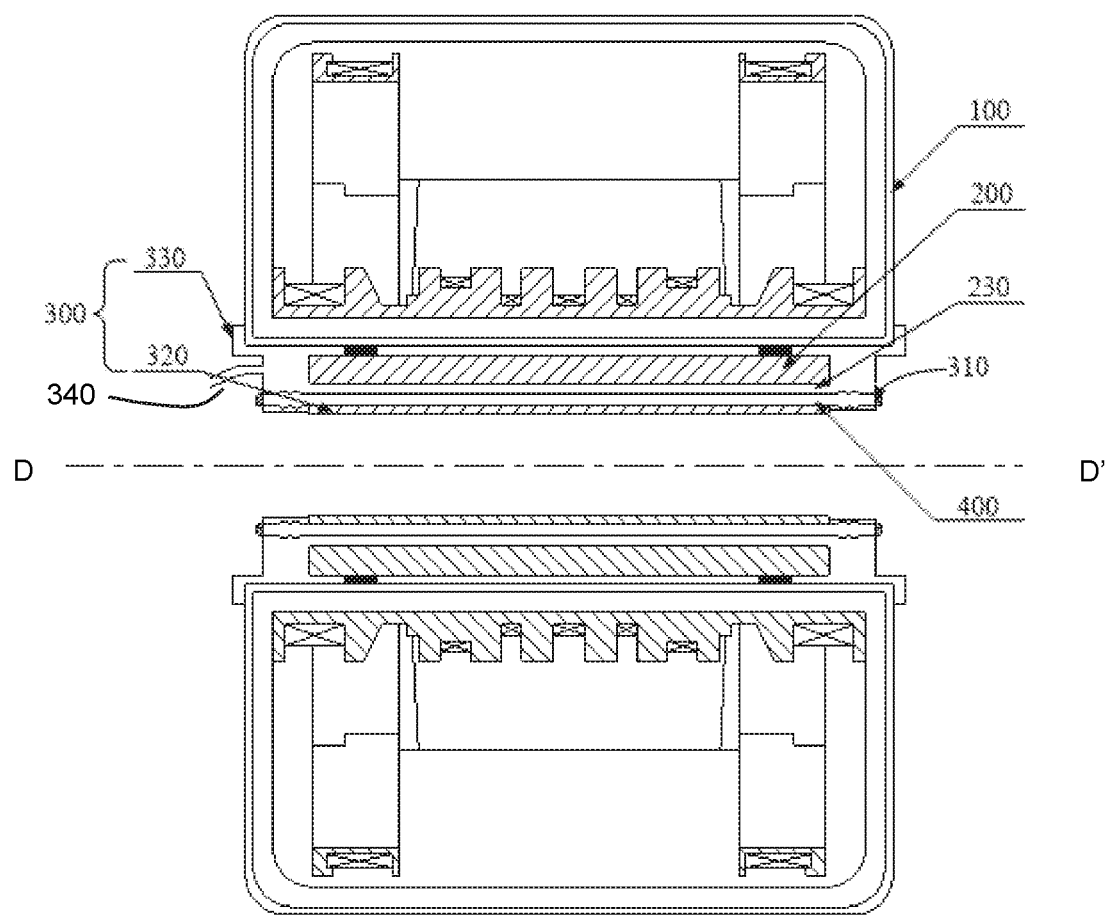
FIG. 6 is a schematic diagram illustrating a sectional view taken along B-B of FIG. 5 according to some embodiments of the present disclosure.

FIG. 6 is a schematic diagram illustrating a sectional view taken along B-B of FIG. 5 according to some embodiments of the present disclosure. Referring to FIG. 5, in some embodiments, one or more shimming conduits 400 may be distributed evenly along the circumferential direction of the vacuum enclosure 300 in the first gap 230. In these circumstances, as shown in FIG. 6, the structure of the MRI device 001 may be symmetrical or substantially symmetrical with respect to the axis DD'.

In some embodiments, the vacuum enclosure 300 may include one or more escape ends 310, one or more soundproof tubes 320, and one or more end caps 330. An end cap 330 may correspond to an escape end 310. As illustrated in FIG. 6, a shimming conduit 400 may include two openings. Accordingly, for each shimming conduit, the vacuum enclosure 300 may include two escape ends 310 corresponding to the two openings. At the same time, two connecting conduits 220 may connect the two openings of the shimming conduit 400 and the two escape ends 310 of the vacuum enclosure 300 such that the shimming conduit 400 is accessible from the ambient environment via the escape end(s) 310 and the connecting conduit(s) 220. The sizes of the shimming conduit 400, the escape end(s) 310 of the enclosure 300, and the connecting conduit(s) 220 may be such that these structures fit each other.

In some embodiments, the vacuum enclosure 300 and at least part of one or more shimming conduits 400 may define a hermetically sealed space. In some embodiments, the vacuum enclosure 300, a shimming conduit 400, and one or more connecting conduits 220 (for example, two connecting conduits 220) may define a hermetically sealed space. The hermetically sealed space may be configured to house the gradient coils 200. In some embodiments, the hermetically sealed space may be evacuated through one or more extraction ports 340, and the gradient coils 200 therein may be in a vacuum environment. At the same time, the interior of the shimming conduit 400 may be in communication with the ambient environment. The communication therebetween may be achieved by a link from the opening(s) of the shimming conduit 400 to the escape end(s) of the vacuum enclosure 300. For example, the connecting conduit 220 may serve as such a link. The interior of the shimming conduit 400 may be hermetically insulated from the hermetically sealed space. When the one or more shimming components are placed in or removed from the shimming conduit 400, the vacuum environment within the hermetically sealed space may remain. The gradient coils 200 may remain in the vacuum environment independent of an operation performed in the shimming conduit 400.

Figure 7:
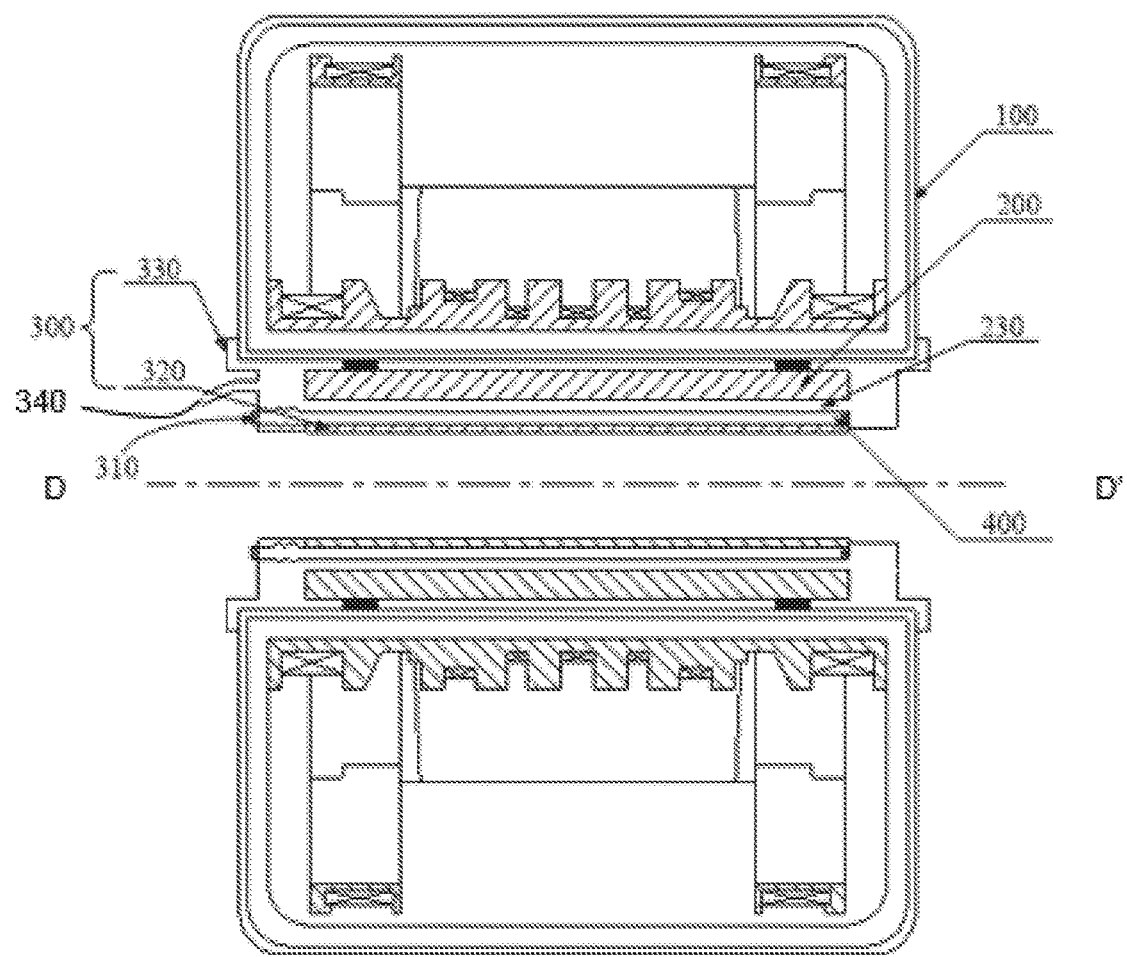
FIG. 7 is a schematic diagram illustrating a sectional view taken along B-B of FIG. 5 according to some embodiments of the present disclosure.

FIG. 7 is a schematic diagram illustrating a sectional view taken along B-B of FIG. 5 according to some embodiments of the present disclosure.

In some embodiments, a shimming conduit 400 may include only one opening. Accordingly, for each shimming conduit 400, the vacuum enclosure 300 may include only one escape end 310 corresponding to the only opening of the shimming conduit 400. At the same time, for each shimming conduit 400, only one connecting conduit 220 may be used to connect the only opening of the shimming conduit 400 and the only escape end 310 of the vacuum enclosure 300 such that the shimming conduit 400 is accessible from the ambient environment via the escape end 310 and the connecting conduit 220. In some embodiments, the other opening of the shimming conduit 400 illustrated in FIG. 6 may be sealed using, for example, silicone, resin, etc. The sealing of the shimming conduit 400 may be hermetic or not.

In some embodiments, the MRI device 001 and components thereof illustrated in FIG. 7 may be substantially the same as those illustrated in FIGS. 5 and 6. For example, a shimming conduit 400 may be located in the first gap 230. The first gap 230 may be located between the interior wall of the gradient coils 200 and the vacuum enclosure 300. As another example, the vacuum enclosure 300, a shimming conduit 400, and a connecting conduit 220 may define a hermetically sealed space. The hermetically sealed space may be evacuated and configured to house the gradient coils 200. Details regarding to the MRI device 001 may be found in the descriptions in connection with FIGS. 2 to 6.

Figure 8:
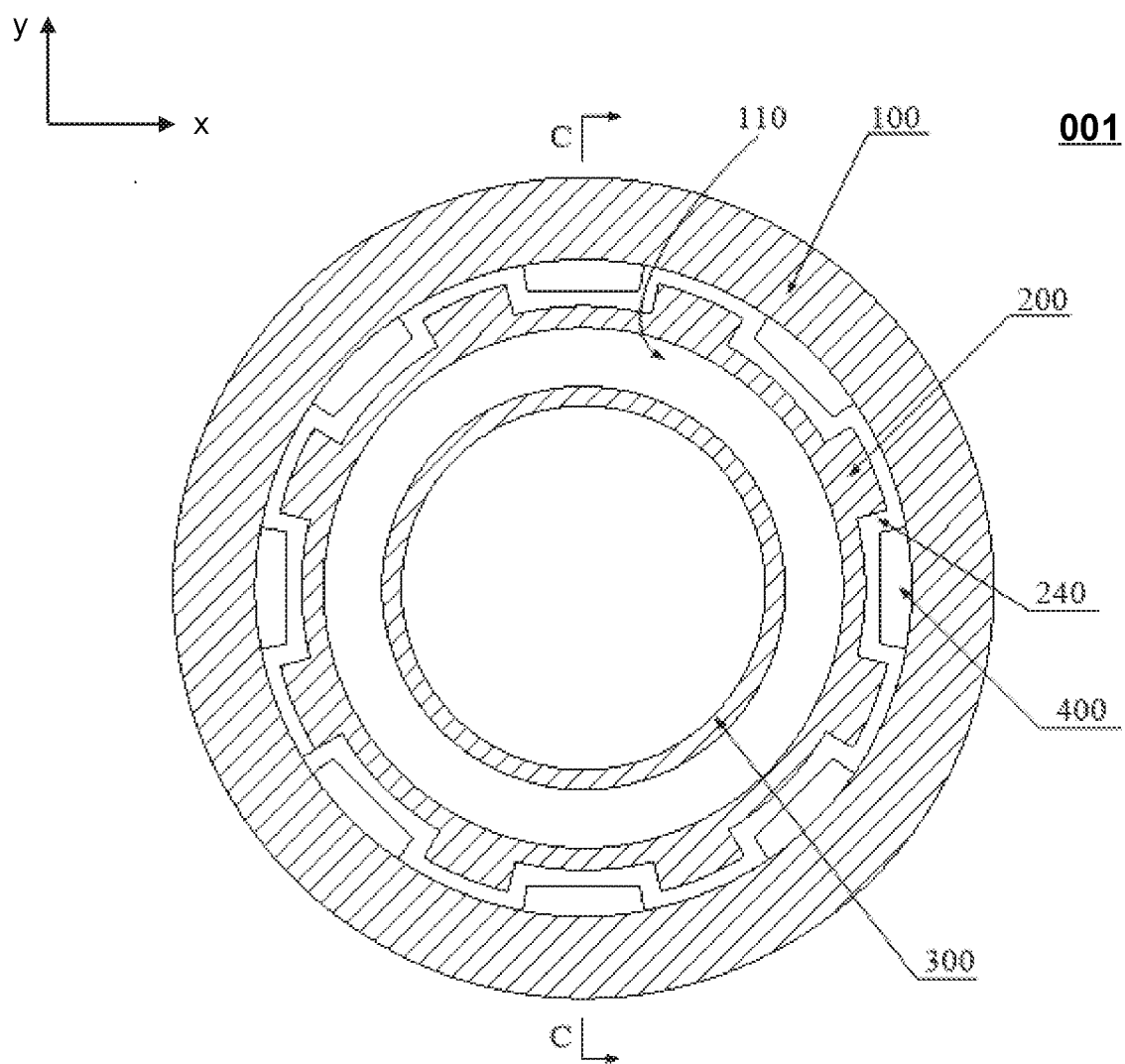
FIG. 8 is a schematic diagram illustrating a sectional view of a third exemplary MRI device according to some embodiments of the present disclosure.

FIG. 8 is a schematic diagram illustrating a sectional view of a third exemplary MRI device 001 according to some embodiments of the present disclosure. The sectional view may be taken along the axis of the main magnet 100.

In some embodiments, the MRI device 001 may lack a shimming space 210. One or more shimming conduits 400 may be located in a gap between the exterior wall of the gradient coils 200 and the vacuum enclosure 300 or a gap (or referred to as a third gap) between the exterior wall of the gradient coils 200 and the main magnet 100. Accordingly, one or more shimming components may be placed in the gap.

As illustrated, the MRI device 001 may include a second gap 240 between the exterior wall of the gradient coils 200 and the vacuum enclosure 300. The second gap 240 may extend axially along the axis of the main magnet 100 (e.g., the axis DD' shown in FIG. 9). In some embodiments, one or more shimming conduits 400 may be distributed circumferentially in the second gap 240. In some embodiments, one or more shimming conduits 400 may be distributed evenly along the circumferential direction of the main magnet 100 in the second gap 240. In some embodiments, at least one of the one or more shimming conduits 400 may be disposed on the interior wall of the main magnet 100 in the second gap 240. It should be understood that, the second gap 240 may also refer to a gap between the exterior wall of the gradient coils 200 and the main magnet 100. The gap between the exterior wall of the gradient coils 200 and the main magnet 100 (or referred to as a third gap) may be the same as or similar to the gap between the exterior wall of the gradient coils 200 and the vacuum enclosure 300, and therefore the description thereof is not repeated here.

In some embodiments, the MRI device 001 and components thereof illustrated in FIG. 8 may be substantially the same as those illustrated in FIG. 2. For example, the MRI device 001 may include the main magnet 100, the gradient coils 200, and the vacuum enclosure 300. The vacuum enclosure 300 may be configured to house the gradient coils 200.

Figure 9:
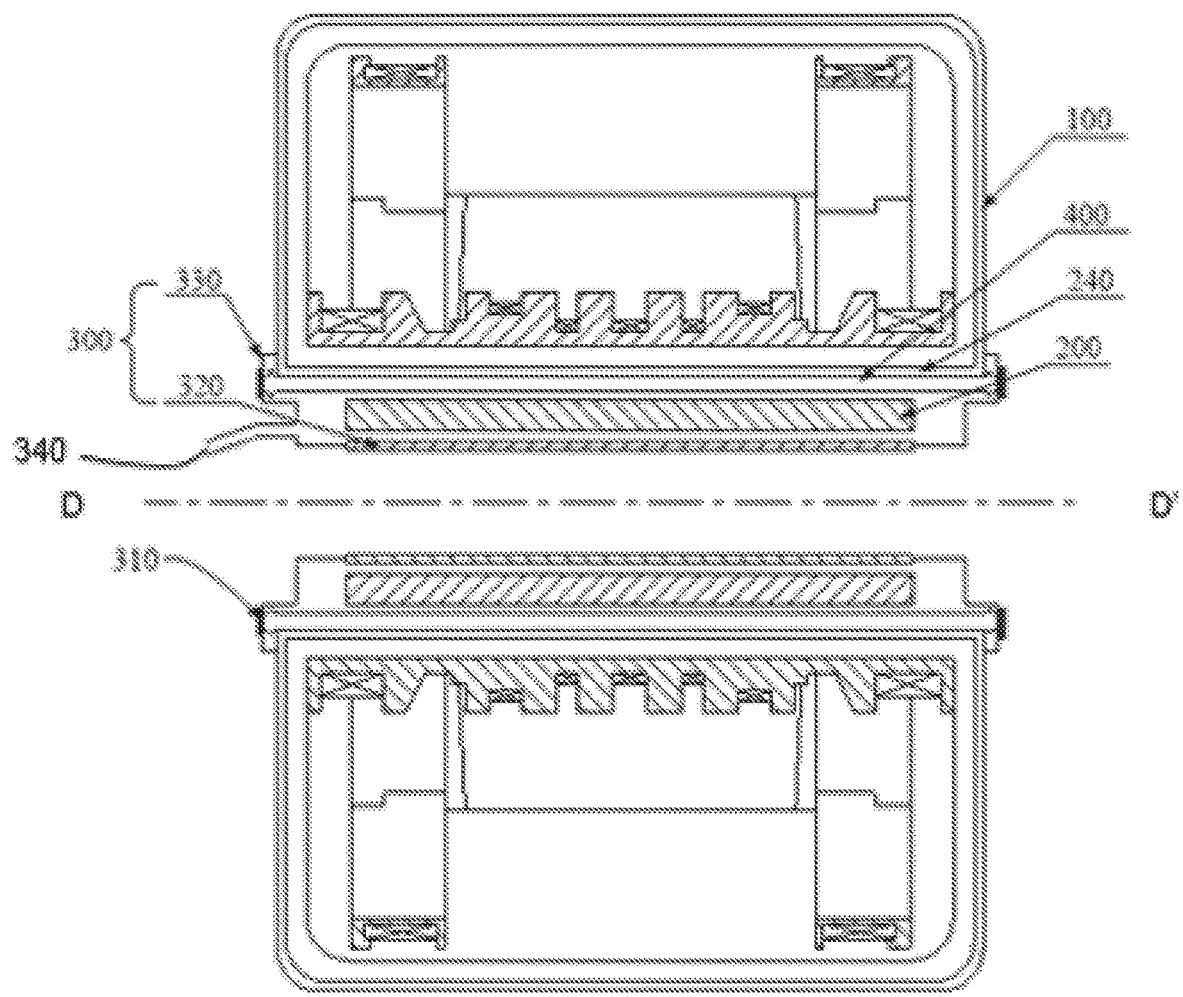
FIG. 9 is a schematic diagram illustrating a sectional view taken along C-C of FIG. 8 according to some embodiments of the present disclosure.

FIG. 9 is a schematic diagram illustrating a sectional view taken along C-C of FIG. 8 according to some embodiments of the present disclosure. Referring to FIG. 8, in some embodiments, one or more shimming conduits 400 may be distributed evenly along the circumferential direction of the main magnet 100 in the second gap 240. In these circumstances, as shown in FIG. 9, the structure of the MRI device 001 may be symmetrical or substantially symmetrical with respect to the axis DD'.

In some embodiments, the vacuum enclosure 300 may include one or more escape ends 310, one or more soundproof tubes 320, and one or more end caps 330. An end cap 330 may correspond to an escape end 310. As illustrated in FIG. 9, a shimming conduit 400 may include two openings. Accordingly, for each shimming conduit, the vacuum enclosure 300 may include two escape ends 310 corresponding to the two openings. At the same time, two connecting conduits 220 may be used to connect the two openings of the shimming conduit 400 and the two escape ends 310 of the vacuum enclosure 300 such that the shimming conduit 400 is accessible from the ambient environment via the escape end(s) 310 and the connecting conduit(s) 220. The sizes of the shimming conduit 400, the escape end(s) 310 of the enclosure 300, and the connecting conduit(s) 220 may be such that these structures fit each other.

In some embodiments, the vacuum enclosure 300 and at least part of one or more shimming conduits 400 may define a hermetically sealed space. In some embodiments, the vacuum enclosure 300, a shimming conduit 400, and one or more connecting conduits 220 (for example, two connecting conduits 220) may define a hermetically sealed space. The hermetically sealed space may be configured to house the gradient coils 200. In some embodiments, the hermetically sealed space may be evacuated through one or more extraction ports 340, and the gradient coils 200 therein may be in a vacuum environment. At the same time, the interior of the shimming conduit 400 may be in communication with the ambient environment. The communication therebetween may be achieved by a link from the opening(s) of the shimming conduit 400 to the escape end(s) of the vacuum enclosure 300. For example, the connecting conduit 220 may serve as such a link. The interior of the shimming conduit 400 may be hermetically insulated from the hermetically sealed space. When the one or more shimming components are placed in or removed from the shimming conduit 400, the vacuum environment within the hermetically sealed space may remain. The gradient coils 200 may remain in the vacuum environment independent of an operation performed in the shimming conduit 400.

Figure 10:
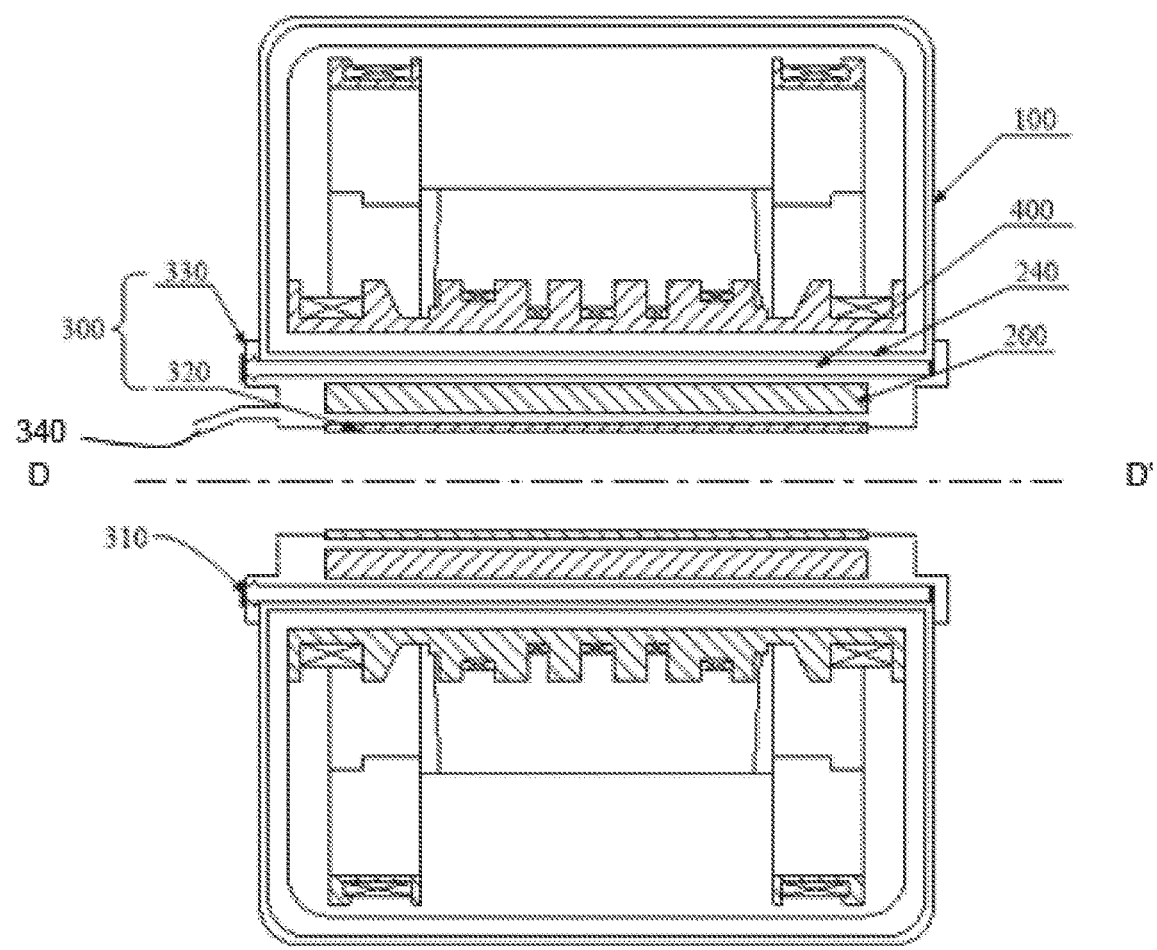
FIG. 10 is a schematic diagram illustrating a sectional view taken along C-C of FIG. 8 according to some embodiments of the present disclosure.

FIG. 10 is a schematic diagram illustrating a sectional view taken along C-C of FIG. 8 according to some embodiments of the present disclosure.

In some embodiments, a shimming conduit 400 may include only one opening. Accordingly, for each shimming conduit 400, the vacuum enclosure 300 may include only one escape end 310 corresponding to the only opening of the shimming conduit 400. At the same time, for each shimming conduit 400, only one connecting conduit 220 may connect the only opening of the shimming conduit 400 and the only escape end 310 of the vacuum enclosure 300 such that the shimming conduit 400 is accessible from the ambient environment via the escape end 310 and the connecting conduit 220. In some embodiments, the other opening of the shimming conduit 400 illustrated in FIG. 10 may be sealed, for example, using silicone, resin, etc. The sealing of the shimming conduit 400 may be hermetic or not.

In some embodiments, the MRI device 001 and components thereof illustrated in FIG. 10 may be substantially the same as those illustrated in FIGS. 8 and 9. For example, a shimming conduit 400 may be located in the second gap 240. The second gap 240 may be located between the exterior wall of the gradient coils 200 and the vacuum enclosure 300. As another example, the vacuum enclosure 300, a shimming conduit 400, and one connecting conduit may define a hermetically sealed space. The hermetically sealed space may be evacuated and configured to house the gradient coils 200. Details regarding to the MRI device 001 may be found in the descriptions in connection with FIGS. 2 to 9.

Figure 11:
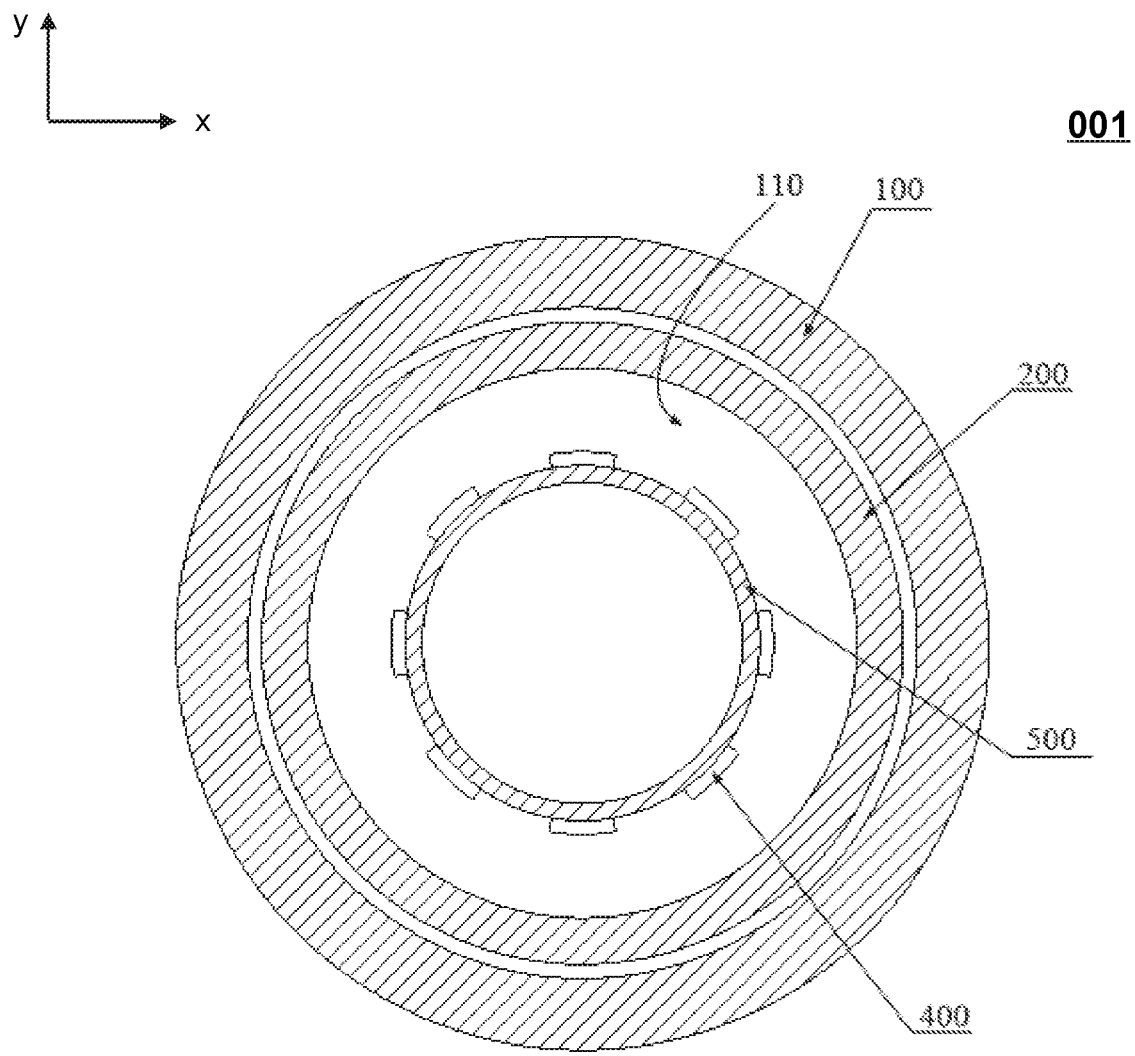
FIG. 11 is a schematic diagram illustrating a sectional view of a fourth exemplary MRI device according to some embodiments of the present disclosure.

FIG. 11 is a schematic diagram illustrating a sectional view of a fourth exemplary MRI device 001 according to some embodiments of the present disclosure. The sectional view may be taken along the axis of the main magnet 100. As illustrated, the MRI device 001 may include the main magnet 100, the gradient coils 200, the one or more shimming conduits 400, body coils 500, and one or more connecting caps.

In some embodiments, a connecting cap may be configured to mechanically connect one end of the body coils 500 and the main magnet 100. A connecting cap may correspond to one end of the body coils 500. In some embodiments, a connecting cap may be made of a metal or an alloy thereof, such as stainless steel.

In some embodiments, the body coils 500 may be located on a side of the gradient coils 200 away from the main magnet 100. In some embodiments, the body coils 500 and the one or more connecting caps together may form the vacuum enclosure 300. Merely by way of example, the body coils 500 may include two ends and the MRI device 001 may include two connecting caps. Thus, both ends of the body coils 500 may be mechanically connected to the main magnet 100 through the two connecting caps. The body coils 500 and the two connecting caps together may form the vacuum enclosure 300.

In some embodiments, the vacuum enclosure 300 may include one or more shimming conduits 400. The vacuum enclosure 300 and the one or more shimming conduits 400 may define a hermetically sealed space. In some embodiments, the one or more shimming conduits 400 may be located within the gradient coils 200, in a gap between the gradient coils 200 and the main magnet 100, or in a gap between the gradient coils 200 and the body coils 500. In some embodiments, the one or more shimming conduits 400 may be disposed on the wall of the body coils 500. The wall of the body coils 500 may be spaced from the gradient coils 200 by a distance.

In some embodiments, one or more components of the MRI device 001 as illustrated in FIG. 11 may be substantially the same as those illustrated in FIG. 2.

It should be noted that the above description of the MRI device 001 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

It should be understood that, according to the above descriptions in connection with FIGS. 5 to 11, a connecting conduit 220 may be separate from a shimming conduit 400. The connecting conduit 220 may be a separate component in the MRI device 001. Alternatively, a connecting conduit 220 may be inseparate from the shimming conduit 400. For example, the connecting conduit 220 may form an integral part of the shimming conduit 400.

Figure 12:
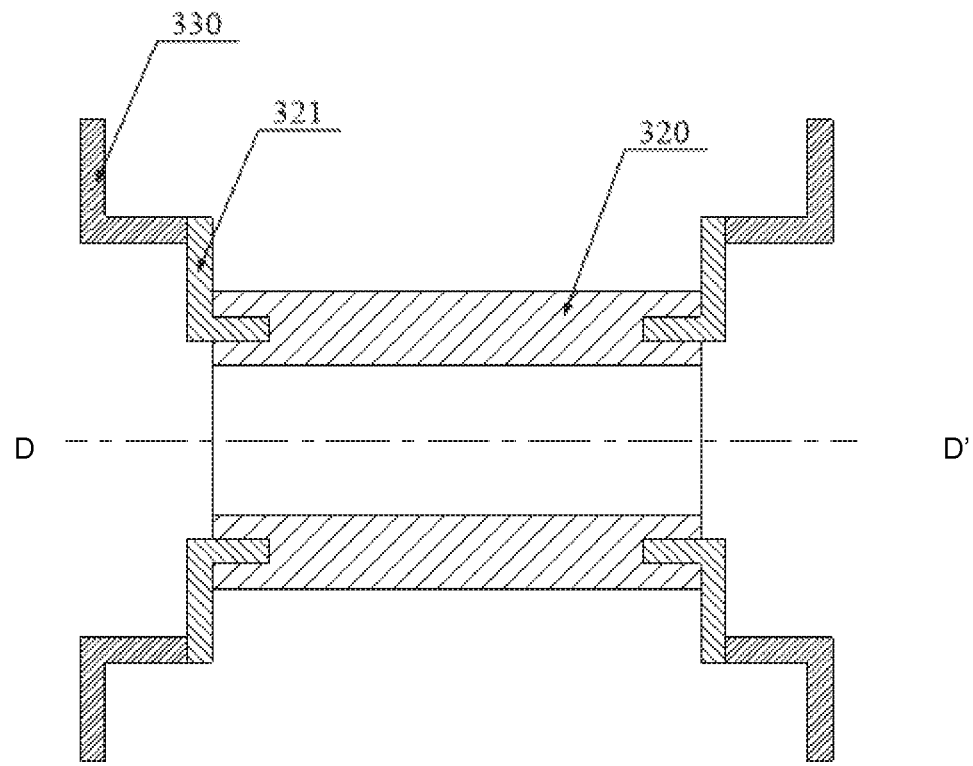
FIG. 12 is a schematic diagram illustrating an exemplary vacuum enclosure according to some embodiments of the present disclosure.

FIG. 12 is a schematic diagram illustrating an exemplary vacuum enclosure according to some embodiments of the present disclosure.

Referring to FIG. 3, the vacuum enclosure 300 may include one or more escape ends 310, one or more soundproof tubes 320, and one or more end caps 330. The vacuum enclosure 300 may further include one or more flanges 321. For example, the vacuum enclosure 300 may include two escape ends 310, a soundproof tube 320, two end caps 330, and two flanges 321. In some embodiments, the soundproof tube 320 may be accommodated in the central bore of the MRI device 001. In some embodiments, the soundproof tube 320 may be located on the side of the gradient coils 200 away from the main magnet 100. In some embodiments, the soundproof tube 320 may be made of a non-metal nonmagnetic material, for example, fiberglass, acrylic, ABS, etc. In some embodiments, the flange(s) 321 may be made of a metal material, for example, stainless steel. The metal material may consolidate a mechanical connection between the flange(s) 321 and the main magnet 100. Alternatively, the flange(s) 321 may be made of a non-metal material with sufficient mechanical strength.

In some embodiments, when the MRI device 001 includes the body coils 500, the body coils 500 may be disposed inside the soundproof tube 320.

As illustrated elsewhere in the present disclosure, body coils 500 and one or more connecting caps together may form the vacuum enclosure 300. In some embodiments, body coils (for example, the body coils 500) may form at least part of the soundproof tube 320. For example, the body coils 500 may form at least part of the walls of the soundproof tube 320. As another example, body coils may form the soundproof tube. In such embodiments, the thickness of the MRI device 001 may be decreased, or the diameter of the imaging area 105 (e.g., the housing cavity 110) may be increased if the thickness of the MRI device 001 remains unchanged. Additionally, the structure of the MRI device 001 may be simplified, and thus the structure-borne transmission of noise generated by the gradient coils 200 may be reduced.

An end cap 330 may be configured to connect the main magnet 100 and the soundproof tube 320. Each end of the soundproof tube 320 may be hermetically connected to an end cap 330. An end cap 330 may be hermetically connected to a corresponding end of the main magnet 100. In some embodiments, the end of the soundproof tube 320 may be connected to an end cap 330 through a flange 321. One end of the flange 321 may be fixed on the end of the soundproof tube 320. The other end of the flange 321 may be connected to the end cap 330 through, e.g., welding, riveting, or the like. In some embodiments, the end cap 330 may be connected to the end of the main magnet 100 through, e.g., welding, riveting, or the like.

The connection between the vacuum enclosure 300 and the main magnet 100 may be implemented on the MRI device 001 illustrated in FIGS. 2 to 11. The connection may be merely an example and not intended to be limiting. For example, the soundproof tube 320 and the end cap(s) 330 may be connected directly without using the flange(s) 321.

Figure 13:
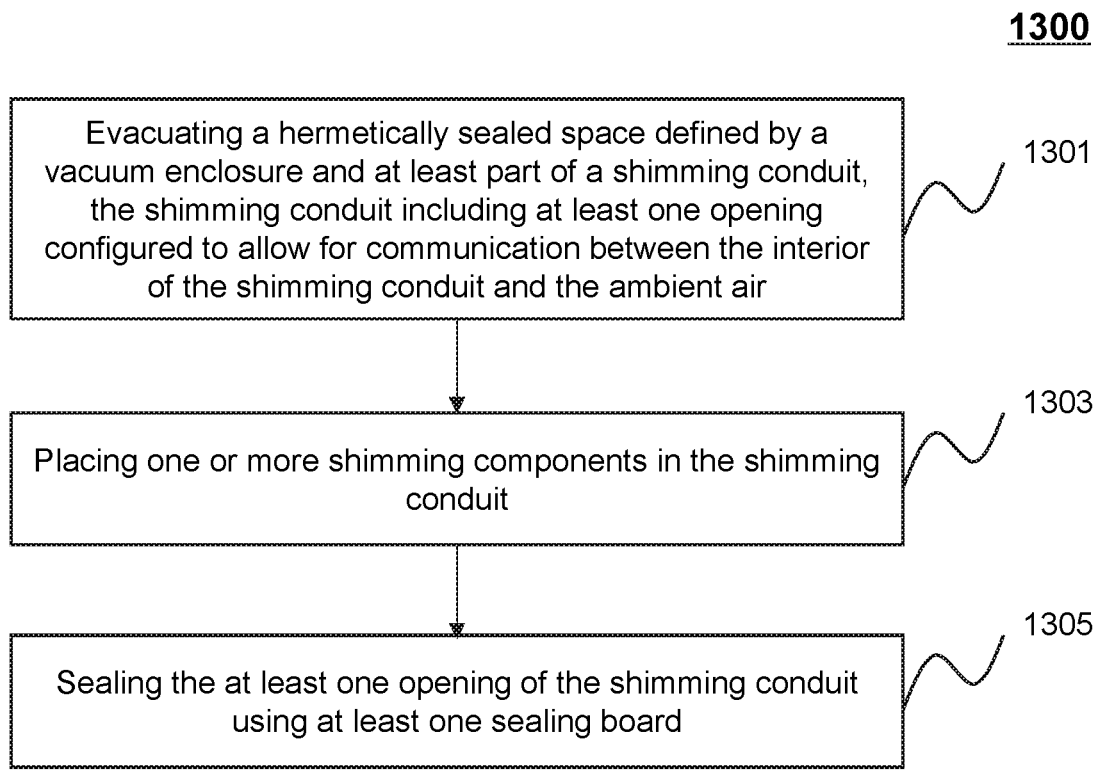
FIG. 13 is a flowchart illustrating an exemplary process for shimming of the MRI device according to some embodiments of the present disclosure.

FIG. 13 is a flowchart illustrating an exemplary process 1300 for shimming of the MRI device 001 according to some embodiments of the present disclosure. In some embodiments, process 1300 may be conducted manually by a user, or automatically or semi-automatically with the assistance of the processor 122. In some embodiments, process 1300 may be implemented on the MRI device 001 as illustrated in FIGS. 2 to 12.

In 1301, a hermetically sealed space defined by the vacuum enclosure 300 and at least part of the shimming conduit 400 may be evacuated. The hermetically sealed space may be maintained in a vacuum environment. As illustrated elsewhere, the shimming conduit 400 may include at least one (e.g., two) opening. An opening of the shimming conduit 400 may be configured to allow for access to the interior of the shimming conduit 400 from, e.g., the ambient environment. In some embodiments, the hermetically sealed space may be hermetically insulated from the interior of the shimming conduit 400. More descriptions regarding the hermetically sealed space may be found elsewhere in the present disclosure. See, e.g., FIGS. 2 to 11 and the descriptions thereof.

In some embodiments, the gradient coils 200 may be placed in the inner space of the vacuum enclosure 300 before the evacuation. Thus, the gradient coils 200 may remain in the vacuum environment.

In 1302, one or more shimming components may be placed in one or more shimming conduit 400 for shimming.

A shimming component may be configured to facilitate the formation of a uniform magnetic field (e.g., the main magnetic field, the gradient magnetic field). The location(s) of the one or more shimming components and the number of the one or more shimming components may be determined according to a specific need. In some embodiments, the processor 122 may be configured to determine the locations and the number according to the specific need. In some embodiments, a shimming component may be a shimming bar.

In some embodiments, one or more shimming components may be placed, removed, replaced, etc., in the one or more shimming conduits 400 located in the gradient coils 200 (i.e., within the gradient coils 200). More descriptions regarding the one or more shimming conduits 400 located in the gradient coils 200 may be found elsewhere in the present disclosure. See, e.g., FIGS. 2 to 4 and FIG. 11 and the descriptions thereof.

In some embodiments, one or more shimming components may be placed in the one or more shimming conduits 400 located in the first gap 230. More descriptions regarding the one or more shimming conduits 400 located in the first gap 230 may be found elsewhere in the present disclosure. See, e.g., FIGS. 5 to 7 and FIG. 11 and the descriptions thereof.

In some embodiments, one or more shimming components may be placed in the one or more shimming conduits 400 located in the second gap 240. More descriptions regarding the one or more shimming conduits 400 located in the second gap 240 may be found elsewhere in the present disclosure. See, e.g., FIGS. 8 to 11 and the descriptions thereof.

In some embodiments, one or more shimming components may be placed, removed, replaced, etc., in the one or more shimming conduits 400 located in the body coils 500. For example, the one or more shimming components may be disposed on the wall of the body coils 500. The wall of the body coils 500 may be away from the gradient coils 200. More descriptions regarding the one or more shimming conduits 400 located in the second gap 240 may be found elsewhere in the present disclosure. See, e.g., FIG. 11 and the descriptions thereof.

In 1303, the at least one opening of the shimming conduit 400 may be sealed using at least one sealing board. The sealing of the at least one opening may prevent the one or more shimming components from dropping or otherwise falling out from the shimming conduit 400.

In these circumstances, the shimming process of the MRI device 001 may be performed without destroying the vacuum environment of the gradient coils 200, thereby making maintenance of the MRI device 001 more convenient.

It should be noted that the above description of process 1300 for shimming is provided for the purpose of illustration, and is not intended to limit the scope of the present disclosure. For persons having ordinary skills in the art, multiple variations and modifications may be made under the teaching of the present disclosure. However, those variations and modifications do not depart from the scope of the present disclosure. In some embodiments, process 1300 may be accomplished with one or more additional operations not described, and/or without one or more of the operations discussed.

Having thus described the basic concepts, it may be rather apparent to those skilled in the art after reading this detailed disclosure that the foregoing detailed disclosure is intended to be presented by way of example only and is not limiting.

Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities of ingredients, properties such as molecular weight, reaction conditions, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A magnetic resonance imaging device comprising: a main magnet, gradient coils, a vacuum enclosure, and a shimming conduit, wherein:
   the vacuum enclosure is configured to house at least part of the shimming conduit;
   the vacuum enclosure and at least part of the shimming conduit defines a hermetically sealed space configured to house the gradient coils;
   the shimming conduit has at least one opening configured to allow for access to an interior of the shimming conduit; and
   the interior of the shimming conduit is hermetically insulated from the hermetically sealed space.

2. The magnetic resonance imaging device of claim 1, wherein:
   the vacuum enclosure includes at least one escape end configured to allow for access to the interior of the shimming conduit.

3. The magnetic resonance imaging device of claim 2, wherein a portion of the shimming conduit is dimensioned to fit snugly with an escape end of the at least one escape end of the vacuum enclosure.

4. The magnetic resonance imaging device of claim 2, wherein an opening of the at least one opening of the shimming conduit is dimensioned to fit snugly with an escape end of the at least one escape end of the vacuum enclosure.

5. The magnetic resonance imaging device of claim 1, wherein at least part of the shimming conduit is located within the gradient coils.

6. The magnetic resonance imaging device of claim 5, wherein:
   the gradient coils include a shimming space; and
   the shimming conduit is located within the shimming space.

7. The magnetic resonance imaging device of claim 5, further comprising a connecting conduit, wherein
   the shimming space and the connecting conduit form the shimming conduit.

8. The magnetic resonance imaging device of claim 7, wherein the connecting conduit is made of a flexible material.

9. The magnetic resonance imaging device of claim 1, wherein:
   the shimming conduit is located within a first gap between the vacuum enclosure and a side wall of the gradient coils, the side wall being away from the main magnet.

10. The magnetic resonance imaging device of claim 1, wherein:
    the shimming conduit is located within a second gap between the vacuum enclosure and a side wall of the gradient coils, the side wall being adjacent to the main magnet.

11. The magnetic resonance imaging device of claim 1, wherein:
    the shimming conduit is located within a third gap between the main magnet and a side wall of the gradient coils, the side wall being adjacent to the main magnet.

12. The magnetic resonance imaging device of claim 1, wherein the vacuum enclosure is formed by body coils and two connecting caps, wherein:
    the body coils are located on a side of the gradient coils away from the main magnet; and
    each connecting cap is configured to connect an end of the body coils to a corresponding end of the main magnet by forming a hermetic seal.

13. A shimming method implemented on a magnetic resonance imaging device; the magnetic resonance imaging device including a main magnet, gradient coils, a vacuum enclosure, and a shimming conduit, the shimming method comprising: placing a shimming component in the shimming conduit, wherein:
    the vacuum enclosure is configured to house at least part of the shimming conduit;
    the vacuum enclosure and at least part of the shimming conduit defines a hermetically sealed space configured to house the gradient coils;
    the shimming conduit has at least one opening configured to allow for access to an interior of the shimming conduit; and
    the interior of the shimming conduit is hermetically insulated from hermetically sealed space of the vacuum enclosure.

14. The shimming method of claim 13, further comprising evacuating the hermetically sealed space.

15. The shimming method of claim 13, further comprising sealing the at least one opening of the shimming conduit using at least one sealing board.

16. A magnetic resonance imaging device comprising: a main magnet, a gradient coil, a vacuum enclosure, and a shimming conduit, wherein:
    the vacuum enclosure is attached to the main magnet and configured to house at least part of the shimming conduit;
    the gradient coil is located in a hermetically sealed space which is defined inside the vacuum enclosure and outside the shimming conduit;
    the shimming conduit has at least one opening configured to allow for access to an interior of the shimming conduit; and
    the interior of the shimming conduit is hermetically insulated from the hermetically sealed space.

17. The magnetic resonance imaging device of claim 16, wherein
    the vacuum enclosure includes a soundproof tube and two end caps,
    the main magnet has a central bore extending along an axial direction,
    the soundproof tube is accommodated in the central bore, and
    each of the two end caps is connected to the main magnet and the soundproof tube.

18. The magnetic resonance imaging device of claim 17, further comprising a body coil disposed inside the soundproof tube.

19. The magnetic resonance imaging device of claim 17, further comprising a body coil, wherein the body coil forms at least part of the soundproof tube.

20. The magnetic resonance imaging device of claim 17, further comprising one or more escape ends and one or more extraction ports, wherein each escape end of the one or more escape ends is dimensioned to fit snugly with the at least one opening of the shimming conduit and configured to allow for access to an interior of the shimming conduit, and each extraction port of the one or more extraction ports is configured to allow for evacuation of the hermetically sealed space.

\* \* \* \* \*